US011910582B2

(12) United States Patent
Kim et al.

(10) Patent No.: US 11,910,582 B2
(45) Date of Patent: Feb. 20, 2024

(54) OUTDOOR DISPLAY APPARATUS

(71) Applicant: SAMSUNG ELECTRONICS CO., LTD., Suwon-si (KR)

(72) Inventors: Sung Ki Kim, Suwon-si (KR); Hyun Jun Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 73 days.

(21) Appl. No.: 17/418,408

(22) PCT Filed: Feb. 19, 2019

(86) PCT No.: PCT/KR2019/001973
§ 371 (c)(1),
(2) Date: Jun. 25, 2021

(87) PCT Pub. No.: WO2020/138586
PCT Pub. Date: Jul. 2, 2020

(65) Prior Publication Data
US 2022/0071050 A1    Mar. 3, 2022

(30) Foreign Application Priority Data

Dec. 27, 2018  (KR) .................. 10-2018-0171072

(51) Int. Cl.
*H05K 7/20* (2006.01)
(52) U.S. Cl.
CPC ....... *H05K 7/2099* (2013.01); *H05K 7/20963* (2013.01); *H05K 7/20972* (2013.01)
(58) Field of Classification Search
CPC ............. H05K 7/2099; H05K 7/20963; H05K 7/20972; G09F 19/22; G09F 27/008;
(Continued)

(56) References Cited

U.S. PATENT DOCUMENTS 6,493,440 B2 *  12/2002  Gromatzky ....... G02F 1/133385
                                                   379/161
2004/0114324 A1 *  6/2004  Kusaka .................. G06F 1/203
                                                   361/699
(Continued)

FOREIGN PATENT DOCUMENTS

EP   2 284 846 A1   2/2011
GB   2 312 499 A   10/1997
(Continued)

OTHER PUBLICATIONS

Extended European Search Report dated Jan. 3, 2022 in European Application No. 19905640.9 (9 pages).
(Continued)

*Primary Examiner* — Mandeep S Buttar
(74) *Attorney, Agent, or Firm* — STAAS & HALSEY LLP

(57) ABSTRACT

An outdoor display apparatus comprises a case including an inlet and an outlet, a display module disposed inside the case and including a display panel on which an image seen through at least a portion of the case is displayed, and a heat exchanger. The heat exchanger comprises a first portion located on a first flow path formed to circulate air to the display module, a second portion to receive heat from the first portion, and located on a second flow path on which outside air is heat-exchanged with air, and a phase change material provided to circulate between the first and second portions, and provided to change a phase from a fluid to a gas. The case comprises a partition wall provided to isolate the first flow path and the second flow path from each other, and the first portion and the second portion are disposed obliquely.

11 Claims, 6 Drawing Sheets

(58) Field of Classification Search
CPC .......... G09F 27/00; F24F 3/044; F28D 15/02; G02F 1/13; G02F 1/1333; G03B 21/16; H04Q 1/02
See application file for complete search history.

(56) References Cited

U.S. PATENT DOCUMENTS

| | | | |
|---|---|---|---|
| 2008/0017360 A1* | 1/2008 | Campbell | F28F 1/30 257/E23.098 |
| 2010/0142149 A1* | 6/2010 | Nakamichi | G09F 9/35 361/701 |
| 2012/0272677 A1* | 11/2012 | Furumaki | F28F 1/128 165/151 |
| 2015/0009627 A1* | 1/2015 | Dunn | G02F 1/133382 361/695 |
| 2016/0198589 A1* | 7/2016 | Kang | G02F 1/133385 361/692 |
| 2017/0172016 A1* | 6/2017 | Kang | G09F 9/35 |
| 2018/0084674 A1 | 3/2018 | Yoon et al. | |
| 2018/0338391 A1 | 11/2018 | Fuller | |
| 2018/0338392 A1* | 11/2018 | Fuller | H05K 7/206 |
| 2020/0012143 A1* | 1/2020 | Wang | G02F 1/133385 |
| 2020/0029460 A1* | 1/2020 | Jeong | H05K 7/20145 |
| 2023/0036767 A1* | 2/2023 | Dunn | G02F 1/133385 |

FOREIGN PATENT DOCUMENTS

| | | |
|---|---|---|
| JP | 10-227554 | 8/1998 |
| JP | 2003-337380 | 11/2003 |
| JP | 2012-118131 | 6/2012 |
| JP | 2018-9715 | 1/2018 |
| KR | 10-2002-0068488 | 8/2002 |
| KR | 10-2010-0137595 | 12/2010 |
| KR | 10-2011-0119357 | 11/2011 |
| KR | 10-2016-0084279 | 7/2016 |
| WO | 2018/062645 A1 | 4/2018 |

OTHER PUBLICATIONS

International Search Report dated Sep. 23, 2019 in International Patent Application No. PCT/KR2019/001973.
European Office Action dated Jun. 28, 2023 for European Application No. 19905640.9.
Korean Office Action dated Sep. 21, 2023 for Korean Application No. 10-2018-0171072.

* cited by examiner

OUTDOOR DISPLAY APPARATUS

CROSS-REFERENCE TO RELATED APPLICATIONS

This application is a U.S. National Stage Application which claims the benefit under 35 U.S.C. § 371 of International Patent Application No. PCT/KR2019/001973, filed on Feb. 19, 2019, which claims the priority benefit of Korean Patent Application No. 10-2018-0171072, filed on Dec. 27, 2018 in the Korean Patent and Trademark Office, the disclosures of which are hereby incorporated by reference in their entirety.

TECHNICAL FIELD

The present disclosure relates to an outdoor display apparatus, and more particularly, to an outdoor display apparatus including a cooler.

BACKGROUND ART

In general, a display apparatus is a device that displays an image on a screen, such as a television, a computer monitor, and a digital information display. Recently, such a display apparatus has been often installed on the outside of building, or outdoors for advertising purposes. The display apparatus includes billboards that are placed outside the building and display images.

Such an outdoor display apparatus, there is a difficulty in that when a display panel is directly exposed to sunlight, a surface temperature of the display panel is increased, causing deterioration.

In addition, the display apparatus includes a display panel (hereinafter, referred to as a liquid crystal panel) and a backlight unit that allows light to be incident on a rear surface of the liquid crystal panel. The liquid crystal panel is formed of a pair of substrates facing each other with a liquid crystal layer therebetween. In the backlight unit, a light source configured to emit light into the liquid crystal panel is provided, and a cold cathode fluorescent tube, a light emitting diode, or the like is used as the light source. The light source of the backlight unit not only generates light but also emits heat, which causes deterioration of the liquid crystal.

Accordingly, the display apparatus includes a cooler configured to dissipate heat generated from the light source of the backlight unit. The cooler includes a structure including a fan and an air filter, and the cooler forms a cooling flow path that cools a front of the liquid crystal panel while sucking outside air using the fan, and the cooler absorbs and discharges solar heat and heat from the liquid crystal panel through the cooling flow path.

The heat dissipation device provided with the fan and air filter requires periodic replacement of the filter, which incurs high maintenance costs, and because the fan and air filter are required to be placed together, it causes a difficulty in that a thickness of the produce is increased as much as a thickness of the fan and air filter.

DISCLOSURE

Technical Problem

The present disclosure is directed to providing an outdoor display apparatus capable of improving cooling efficiency by including an improved cooler.

The present disclosure is directed to providing an outdoor display apparatus including a cooler including a phase change material.

The present disclosure is directed to providing an outdoor display apparatus capable of improving cooling efficiency by various convective heat dissipation by including a closed channel in the front and a flow channel in the rear.

The present disclosure is directed to providing an outdoor display apparatus capable of improving aesthetics by making a product slim.

Technical Solution

One aspect of the present disclosure provides an outdoor display apparatus including a case including an inlet and an outlet, a display module disposed inside the case and including a display panel on which an image seen through at least a portion of the case is displayed, and a heat exchanger disposed to receive heat from the display module. The heat exchanger includes a first portion located on a first flow path formed to circulate air to the display module, a second portion provided to receive heat from the first portion, and located on a second flow path on which outside air is heat-exchanged with air, and a phase change material provided to circulate between the first portion and the second portion, and provided to change a phase from a fluid to a gas. The case includes a partition wall provided to isolate the first flow path and the second flow path from each other, and the first portion and the second portion are disposed obliquely.

The heat exchanger may include a head portion provided to receive heat from the display module and provided to accommodate the phase change material therein, a tube portion connected to the head portion to circulate the phase change material, and a heat exchange fin portion provided to increase a heat transfer of the tube portion.

The first portion and the second portion may be provided to be connected via the tube so as to communicate with each other, and at least a portion of the first portion may be disposed in contact with the display module.

The partition wall may be provided to isolate at least a portion of the first portion and the second portion.

The first portion may be positioned lower than the second portion.

The heat exchanger may include a partition wall mounting portion formed on at least a portion of the heat exchange fin portion.

The heat exchanger may include any one of a plurality of cooling fins or heat sinks or heat pipes.

The first flow path may be formed in closed space and may further include a first fan configured to circulate air.

The second flow path may further include a second fan provided to allow air, which is sucked through the inlet, to be heat-exchanged through the second portion and to be discharged through the outlet.

The heat exchange fin portion may include any one of a stack fin or a folded fin.

The heat exchanger may include at least one of copper, stainless steel, aluminum, and plastic.

Another aspect of the present disclosure provides an outdoor display apparatus including a case including an inlet and an outlet, a display module disposed inside the case and including a display panel on which an image seen through at least a portion of the case is displayed, and a heat exchanger disposed to receive heat from the display module. The heat exchanger includes a first portion located on a first flow path formed to circulate air to the display module, a second portion provided to receive heat from the first portion, and located on a second flow path on which air, which is introduced through the inlet, is heat-exchanged and then discharged through the outlet. The first portion and the second portion are integrally formed to be connected to each other so as to allow a phase change material to be circulated therein.

The heat exchanger may include a head portion provided to receive heat from the display module and provided to accommodate the phase change material therein, a tube portion connected to the head portion to circulate the phase change material, and a heat exchange fin portion provided to increase a heat transfer of the tube portion The first portion and the second portion may be provided to be connected via the tube portion so as to communicate with each other, and at least a portion of the first portion may be disposed in contact with the display module.

The case may include a partition wall provided to isolate the first flow path and the second flow path from each other, and at least one portion of the partition wall may define the first portion and the second portion.

The first portion may be positioned lower than the second portion.

The heat exchanger may include a partition wall mounting portion formed on at least a portion of the heat exchange fin portion.

The heat exchanger may include at least one of copper, stainless steel, aluminum, and plastic.

Advantageous Effects

An outdoor display apparatus may improve cooling performance by including a cooler including a phase change material.

An outdoor display apparatus may improve cooling efficiency by various convective heat dissipation by including a closed channel in the front and a flow channel in the rear.

It is possible to improve aesthetics by making a product slim.

MODES OF THE INVENTION

Figure 1:
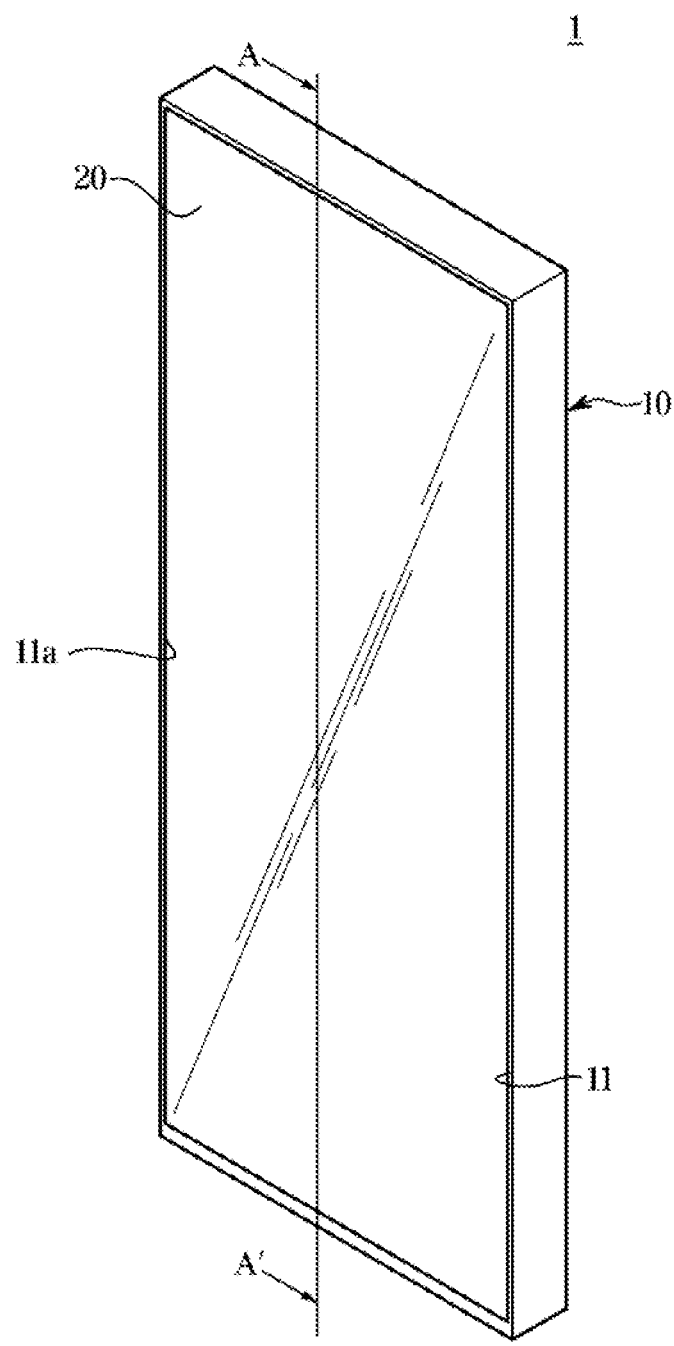
FIG. 1 is a perspective view schematically illustrating an outdoor display apparatus according to one embodiment of the present disclosure.

Embodiments described in the disclosure and configurations shown in the drawings are merely examples of the embodiments of the disclosure, and may be modified in various different ways at the time of filing of the present application to replace the embodiments and drawings of the disclosure.

In addition, the same reference numerals or signs shown in the drawings of the disclosure indicate elements or components performing substantially the same function.

Also, the terms used herein are used to describe the embodiments and are not intended to limit and/or restrict the disclosure. The singular forms "a," "an" and "the" are intended to include the plural forms as well, unless the context clearly indicates otherwise. In this disclosure, the terms "including", "having", and the like are used to specify features, numbers, steps, operations, elements, components, or combinations thereof, but do not preclude the presence or addition of one or more of the features, elements, steps, operations, elements, components, or combinations thereof.

It will be understood that, although the terms first, second, third, etc., may be used herein to describe various elements, but elements are not limited by these terms. These terms are only used to distinguish one element from another element. For example, without departing from the scope of the disclosure, a first element may be termed as a second element, and a second element may be termed as a first element. The term of "and/or" includes a plurality of combinations of relevant items or any one item among a plurality of relevant items.

Figure 2:
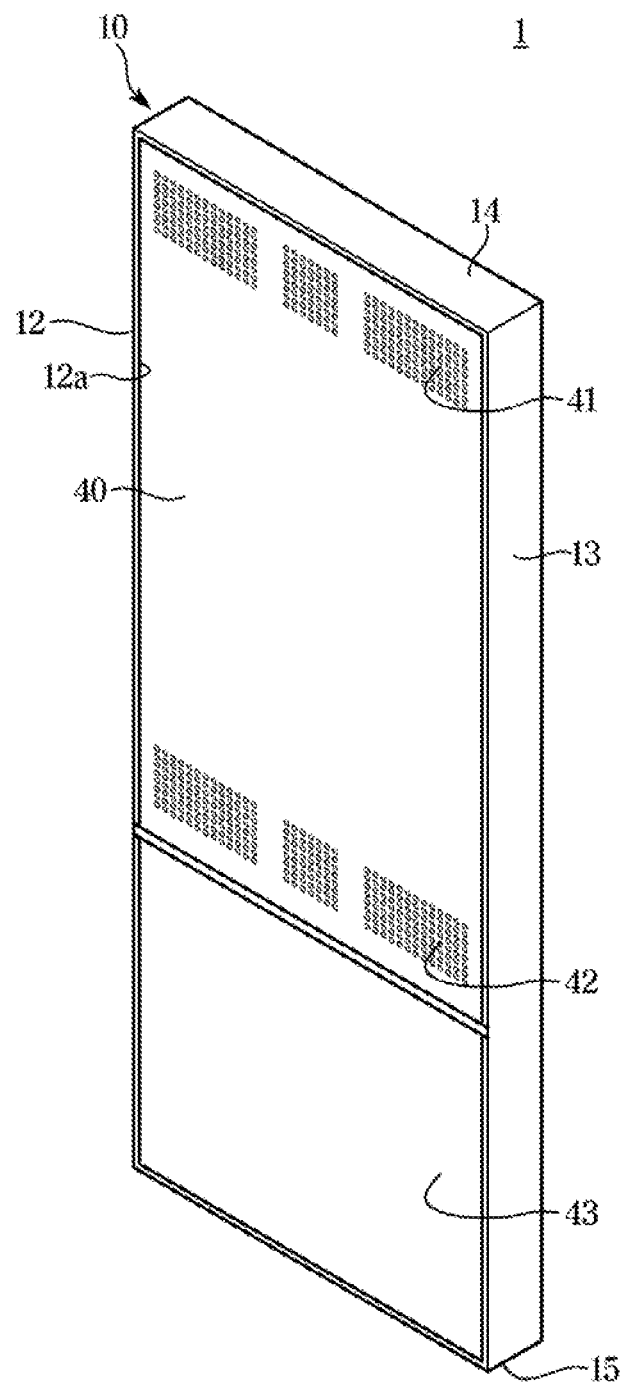
FIG. 2 is a rear-perspective view schematically illustrating the outdoor display apparatus according to one embodiment of the present disclosure.
Figure 3:
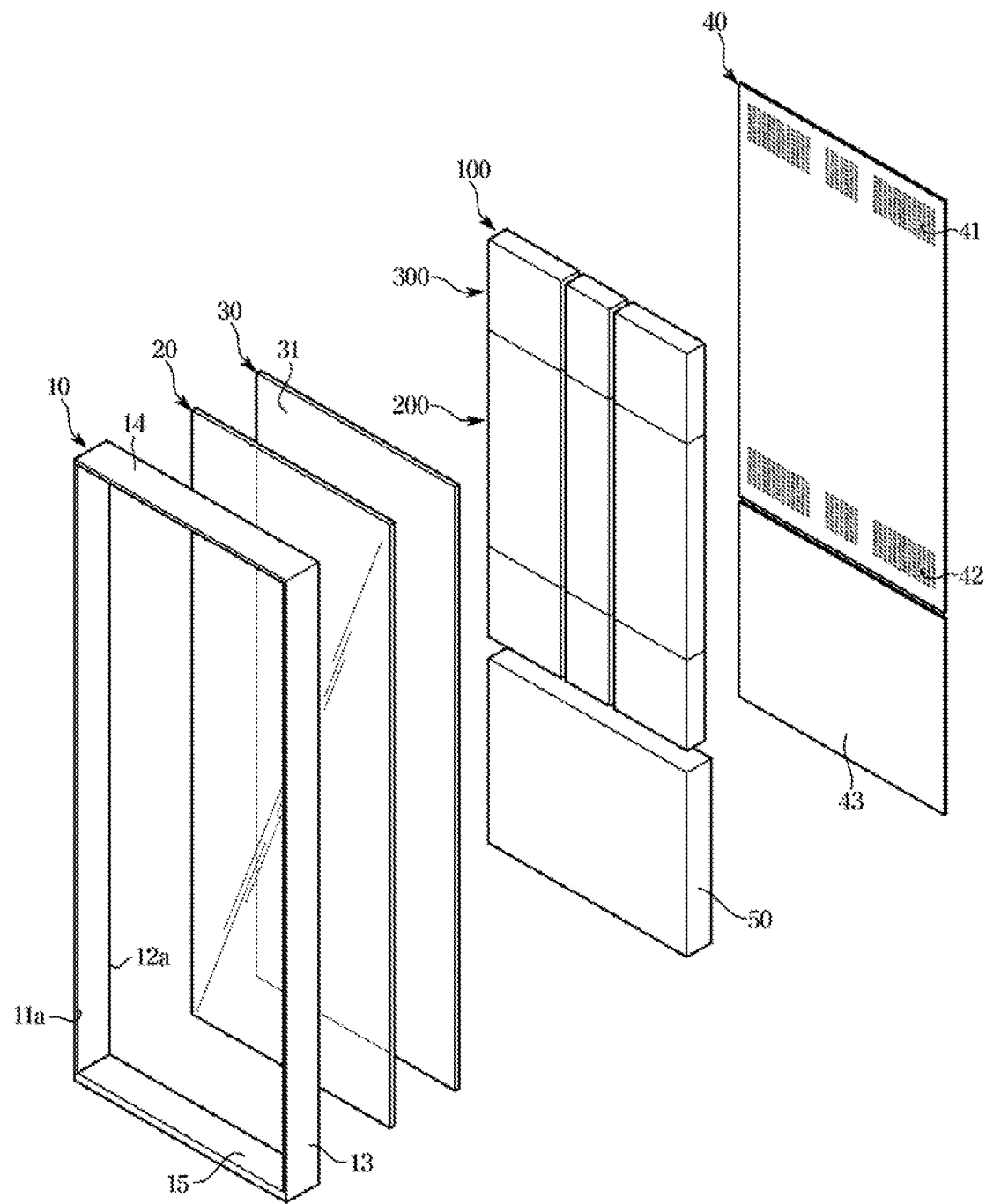
FIG. 3 is an exploded perspective view illustrating the outdoor display apparatus according to one embodiment of the present disclosure.

The disclosure will be described more fully hereinafter with reference to the accompanying drawings FIG. 1 is a perspective view schematically illustrating an outdoor display apparatus according to one embodiment of the present disclosure, FIG. 2 is a rear-perspective view schematically illustrating the outdoor display apparatus according to one embodiment of the present disclosure, and FIG. 3 is an exploded perspective view illustrating the outdoor display apparatus according to one embodiment of the present disclosure.

FIGS. 1 to 3 are views illustrating an outdoor display apparatus according to one embodiment of the present disclosure.

As illustrated in FIGS. 1 to 3, a display apparatus 1 includes a case 10 provided to form an exterior and including an opening 11a formed on a front surface of the case 10, a glass 20 provided in the opening 11a of the case 10 and a display module 30 provided inside the case 10 to display an image.

The case 10 is provided to be installed outdoors, and includes a front surface 11 and a rear surface 12, and a plurality of side surfaces 13 provided to connect between the front surface 11 and the rear surface 12. The side surface 13 includes an upper surface 14 and a lower surface 15 and left and right surfaces 13.

The opening 11a may be formed on at least a portion of the front surface 11. In the embodiment, it is illustrated that the front surface 11 of the case 10 is provided in such a way that the opening 11a is formed in the entire area on the front surface of the case 10, and the glass 20 is installed in the opening 11a. However, the present disclosure is not limited thereto. For example, only a part of an upper portion of the front surface may be opened and a lower portion may be formed as a case.

The glass 20 provided in the opening 11a of the front surface 11 may be formed of a transparent material including a transparent member having sufficient rigidity such as tempered glass.

A film 21 provided to block reflected light caused by external light may be provided on an inner surface of the glass 20. The film 21 may include a polarizing film (refer to FIG. 6)

The glass 20 is formed in a size corresponding to the display module 30 provided inside the case 10, and the glass 20 is provided to allow an image, which is displayed on the display module 30 installed inside the case 10, to be seen from the outside of the case 10.

An opening 12a may be formed in at least a portion of the rear surface 12 of the case 10. In the embodiment, it is illustrated that the rear surface 12 of the case 10 is provided in such a way that the opening 12a is formed in the entire area on the rear surface of the case 10, and a rear cover 40 is installed in the opening 12a. However, the present disclosure is not limited thereto. For example, only a part of an upper portion of the rear surface may be opened and a lower portion may be formed as a case.

An electronic portion 50, on which a circuit board or the like is installed, may be provided at an inner lower portion of the rear surface 12 of the case 10. The rear surface 12 of the case 10 may further include an electronic portion cover 43 provided to cover the electronic portion 50. In the embodiment of the present disclosure, it is illustrated that the electronic portion cover 43 is formed separately from the rear cover 40, but the present disclosure is not limited thereto. For example, the electronic portion cover and the rear cover may be integrally formed.

An inlet 41 is formed in the rear cover 40 of the case 10 to allow external air (hereinafter, referred to as outside air) to be introduced into the case 10. The inlet 41 may be formed in plural. The inlet 41 may be disposed in an upper portion of the rear cover 40 of the case 10. In the embodiment of the present disclosure, three inlets 41 are arranged at a predetermined interval, but the present disclosure is not limited thereto. For example, the size and number of the inlet may vary in accordance with the size or shape of the display apparatus.

At a lower end portion of the rear cover 40 of the case 10, an outlet 42 provided to discharge the outside air introduced through the inlet 41 to the outside is provided. The outlet 42 may be formed in plural.

The display module 30 and a frame (not shown) provided to support the display module 30 may be provided inside the case 10. The frame is installed inside the case 10 so as to support the display module 30.

The display module 30 includes a display panel 31 provided to display an image to be described later, and a backlight unit (not shown) provided on the display panel 31 to emit light to the display panel 31.

The outdoor display apparatus 1 is provided with at least one circuit board (not shown) configured to operate the display module 30 by applying a signal to the display panel 31. The circuit board is equipped with various control means such as a central processing unit (CPU) and Symmetric multiprocessing (SMP) configured to perform functions by exchanging information from each other, and the control means generate heat as a heating element.

The outdoor display apparatus 1 may be deteriorated by heat generated internally by the control means and heat generated by external sunlight.

Accordingly, a cooler 100 configured to maintain an internal temperature of the case 10 within a predetermined range may be provided inside the case 10.

The cooler 100 may include a blower 300 and a heat exchanger 200. The blower 300 is configured to circulate air.

The blower 300 is configured to efficiently distribute or dissipate heat from a high heat source such as the display module 30.

Figure 4:
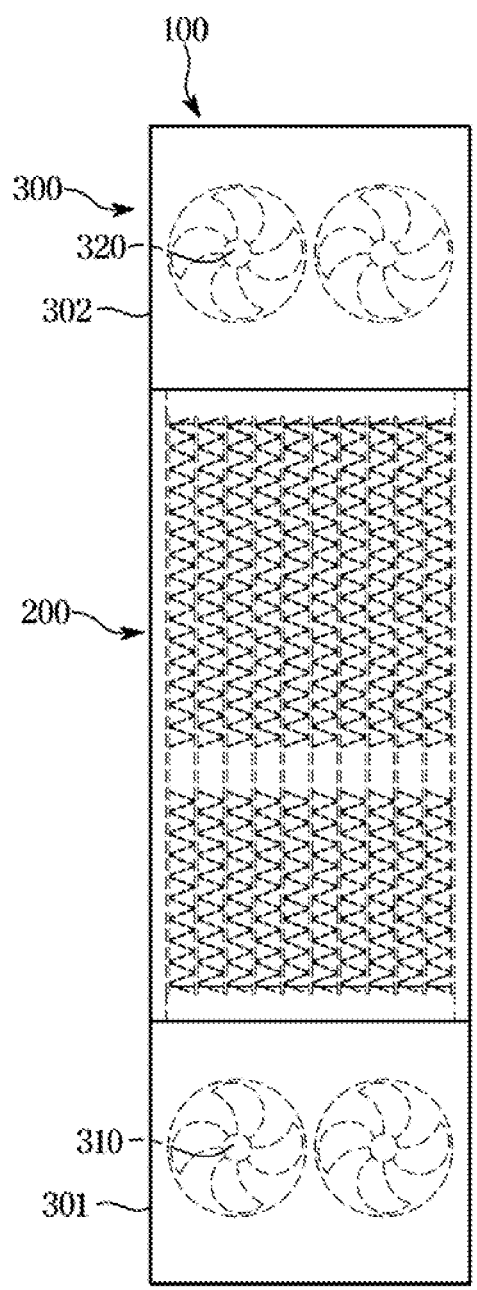
FIG. 4 is a view illustrating a cooler of the outdoor display apparatus according to one embodiment of the present disclosure.
Figure 5:
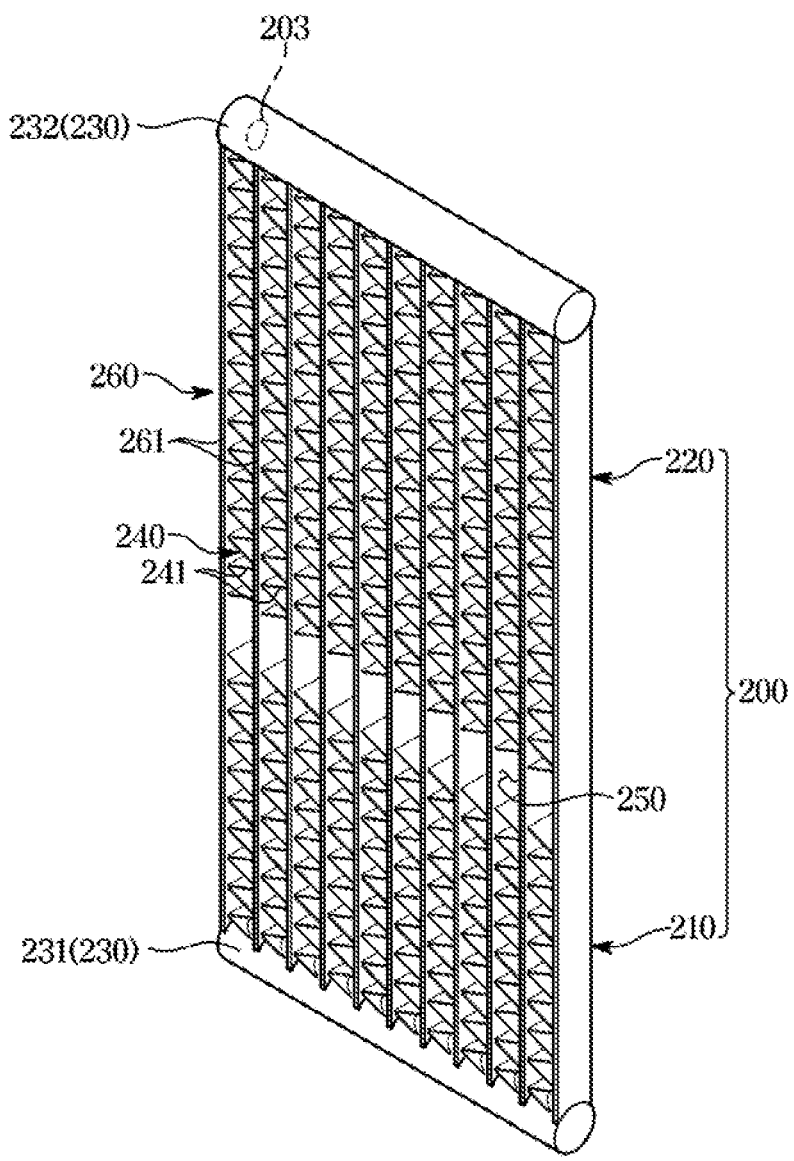
FIG. 5 is a perspective view illustrating a heat exchanger of the cooler according to one embodiment of the present disclosure.
Figure 6:
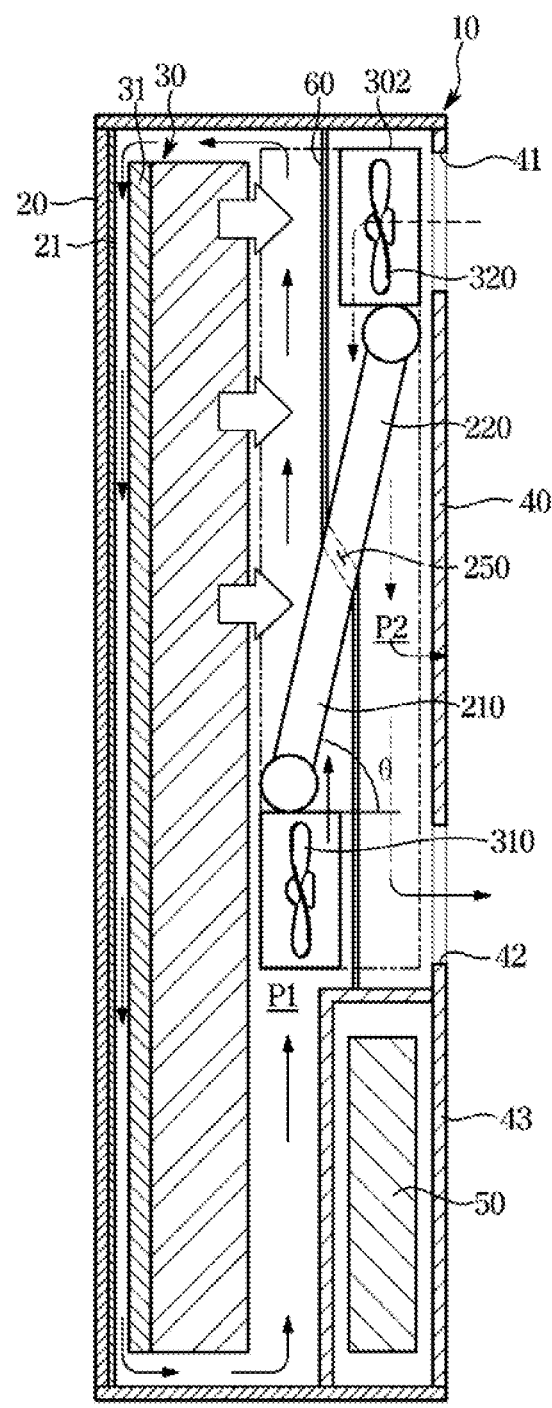
FIG. 6 is a cross-sectional view schematically illustrating an air circulation path of the cooler of the outdoor display apparatus according to one embodiment of the present disclosure.

FIG. 4 is a view illustrating a cooler of the outdoor display apparatus according to one embodiment of the present disclosure, FIG. 5 is a perspective view illustrating a heat exchanger of the cooler according to one embodiment of the present disclosure, and FIG. 6 is a cross-sectional view schematically illustrating an air circulation path of the cooler of the outdoor display apparatus according to one embodiment of the present disclosure.

As illustrated in FIGS. 4 to 6, the cooler 100 may include the heat exchanger 200 and the blower 300.

The blower 300 may include a first fan 310 and a second fan 320 disposed below and above the heat exchanger 200, respectively. The first fan 310 may be disposed below the heat exchanger 200. The second fan 320 may be disposed above the heat exchanger 200. Two first fans 310 and two second fans 320 may be provided. The first fan 310 and the second fan 320 may be installed in a first fan case 301 and a second fan case 302, respectively.

The outdoor display apparatus 1 includes a first flow path P1 provided to allow air to be circulated in a closed state, and a second flow path P2 isolated from the first flow path P1 and provided to allow outside air, which is introduced from the outside, to be heat-exchanged and then to be discharged to the outside.

The first flow path P1 and the second flow path P2 are provided inside the case 10 and partitioned by a partition wall 60. The first flow path P1 is disposed in a front portion of the case 10, and the second flow path P2 is disposed in a rear portion of the case 10. The first flow path P1 may be provided between the glass 20 of the front surface 11 of the case 10 and the display panel (not shown), and between the display module 30 and the partition wall 60. The first flow path P1 may be provided around the display module 30. At least a part of the heat exchanger 200 may be disposed in the first flow path P1.

The second flow path P2 may be provided between the partition wall 60 and an inner side of the rear surface 12 of the case 10. The second flow path P2 may be formed to allow outside air, which is sucked through the inlet 41 of the case 10, to be heat-exchanged through the heat exchanger 200 and to be discharged through the outlet 42. At least another part of the heat exchanger 200 may be disposed in the second flow path P2.

The first fan 310 is configured to circulate air in the first flow path P1. The first fan 310 is configured to circulate air in the closed first flow path P1 so as to allow the air to be heat-exchanged by the heat exchanger 200.

The second fan 320 is provided to move air in the second flow path P2 to allow the air to be heat-exchanged by the heat exchanger 200. The second flow path P2 may be provided to allow air, which is sucked through the inlet 41 of the case 10, to be heat-exchanged by the heat exchanger 200 and to be discharged through the outlet 42. The second fan 320 is configured to suck outside air from the outside into the case 10 to allow the sucked outside air to be heat-exchanged by the heat exchanger 200 and to be discharged through the outlet 42.

The heat exchanger 200 may include a first portion 210 positioned on the first flow path P1 and a second portion 220 connected to the first portion 210 to receive heat from the first portion 210. The second portion 220 is positioned on the second flow path P2.

The first portion 210 and the second portion 220 of the heat exchanger 200 are provided to be connected to each other. The heat exchanger 200 includes a phase change material provided to circulate between the first portion 210 and the second portion 220 and provided to change a phase from a fluid to a gas.

The phase change material is provided in a liquid state in the first portion 210 of the heat exchanger 200, and when heat is generated by the display module 30, the phase is changed from the liquid state to that gaseous state by absorbing the generated heat.

The partition wall 60 provided to define the first flow path P1 and the second flow path P2 is provided between the first portion 210 and the second portion 220. The first portion 210 and the second portion 220 may be isolated by the partition wall 60. The first portion 210 and the second portion 220 may be partitioned by the partition wall 60. The first portion 210 and the second portion 220 of the heat exchanger 200 may be partitioned by the partition wall 60. The first portion 210 of the heat exchanger 200 may be positioned lower than the second portion 220. The first portion 210 and the second portion 220 may be disposed obliquely. The heat exchanger 200 may be formed in a square plate shape. The first portion 210 of the heat exchanger 200 may be disposed to be in contact with at least a part of the rear surface of the display module 30. The second portion 220 of the heat exchanger 200 may be disposed close to the upper inlet 41 side of the case 10. The heat exchanger 200 may be disposed at a predetermined angle θ.

High-temperature heat generated from the display module 30 is transferred to the second portion 220 through the first portion 210 of the heat exchanger 200, and the heat is absorbed and dissipated through the first portion 210 and the second portion 220 of the heat exchanger 200.

The heat exchanger 200 may include a head portion 230 in which a phase change material is accommodated, a tube portion 260 connected to the head portion 230 to allow the phase change material to be circulated, and a heat-exchange fin portion 240 provided to increase a heat transfer of the tube portion 260.

The head portion 230 may include a first head 231 and a second head 232. The first head 231 may be provided in the first flow path P1. A phase change material may be accommodated in the first head 231. The first head 231 may be disposed at a lower end of the heat exchanger 200.

The first head 231 and the second head 232 may be connected to each other through the tube portion 260. The first head 231 may be disposed at the lower end of the heat exchanger 200 and the second head 232 may be disposed at an upper end of the heat exchanger 200. At least one of the first head 231 and the second head 232 may be provided with an inlet portion 203 provided to introduce a phase change material. In the embodiment of the present disclosure, it is illustrated that the inlet portion 203 is formed in the second head 232, but the present disclosure is not limited thereto. Alternatively, the inlet portion may be formed in the first head.

The tube portion 260 may include a plurality of tubes 261 connected to the first head 231. The plurality of tubes 261 may be arranged spaced apart at a predetermined interval. The plurality of tubes 261 may be connected to the first head 231 to extend upwardly. The plurality of tubes 261 is provided to allow the phase change material to be circulated. The phase change material circulated through the plurality of tubes 261 may be heat-transferred by the heat exchange fin portion 240 so as to dissipate heat.

The heat exchange fin portion 240 may be formed by stacking a heat exchange fin 241. The heat exchange fin 241 may be disposed between the plurality of tubes 261. A partition wall mounting portion 250 may be formed by opening at least a portion of the heat exchange fins 241. A location of the partition wall mounting portion 250 formed on the heat exchange fins 241 may vary in accordance with the size and type of the display apparatus 1. In the embodiment of the present disclosure, it is illustrated that the heat exchange fin portion is formed by stacking a heat exchange fin, but is not limited thereto. Alternatively, the heat exchanger may include any one of a plurality of cooling fins or a heat sink or a heat pipe.

The heat exchange fin portion 240 of the heat exchanger 200 may be formed in various forms including an inclination suitable for a flow path in accordance with an arrangement form of the heat exchange fin 241. It is appropriate that the heat exchange fin 241 is arranged to minimize the pressure drop.

The first portion 210 of the heat exchanger 200 may include at least a portion of the first head 231 and the plurality of tubes 261, and at least a portion of the heat exchange fin portion 240. The second portion 220 may include at least another portion of the second head 232 and the plurality of tubes 261 and at least another portion of the heat exchange fin portion 240. The first portion 210 and the second portion 220 may be variously designed in accordance with the size and shape of the outdoor display apparatus 1.

The high heat of the display module 30 transferred through the first portion 210 of the heat exchanger 200 is heat-exchanged with the phase change material of the first head 231 so as to be cooled and circulated in the first flow path P1. The heat transferred from the first portion 210 to the second portion 220 is cooled by the outside air sucked through the inlet 41 in the second flow path P2 and discharged through the outlet 42.

A brief description of a moving process of air flowing through the first flow path P1 and the second flow path P2 of the outdoor display apparatus 1 is as follows.

In the outdoor display apparatus 1 installed outdoors, solar radiation or the like may be incident through the glass 20, and thus heat may be generated.

In addition, the outdoor display apparatus 1 generates heat by the display module 30, the backlight unit, and the electronic portion 50.

The cooler 100 provided inside the outdoor display apparatus 1 may absorb and dissipate the heat.

Air circulating inside the first flow path P1 by the first fan 310 may be heat-exchanged and circulated through the first portion 210 of the heat exchanger 200 in contact with at least a portion of the display module 30.

Air in the first flow path P1 may form an air flow by the first fan 310 to transfer high-temperature air, which is caused by the incident solar heat, to the first portion 210 of the heat exchanger 200 and thus the air may be heat-exchanged and cooled so as to be circulated in the first flow path P1 by the first fan 310.

The air cooled by the heat exchange with the phase change material of the first portion 210 may cool the front and rear of the display module 30 while circulating inside the first flow path P1.

Heat transferred to the second portion 220 through the first portion 210 may be cooled by the heat exchange with the outside air that is sucked by the second fan 320 so as to flow inside the second flow path P2. A temperature of the phase change material of the first portion 210 is lowered while being circulated along the plurality of tubes 261. Air heat-exchanged with the second portion 220 may be discharged to the outside of the case 10 through the outlet 42.

The first flow path P1 formed by the first portion 210 of the heat exchanger 200 may be connected to a space between the glass 20 and the display panel to allow air to be circulated in the closes state, and thus the first flow path P1 may be blocked from the outside so as to prevent foreign substances, such as dust and water, from entering the first flow path P1.

The air in the second flow path P2 is guided by the second fan 320 and sucked through the inlet 41, and heat-exchanged while passing through the second portion 220 of the heat exchanger 200, and then discharged through the outlet 42.

Accordingly, the display module 30 disposed inside the case 10 is first cooled by the first flow path P1, in which air is circulated in the closed state, and the display module 30 is secondly cooled by the outside air flowing through the second flow path P2 and by the second portion 220 of the heat exchanger 200, thereby improving the cooling efficiency.

In the embodiment of the present disclosure, it is illustrated that the heat exchanger 200 of the cooler 100 is a single plate shape including the first portion 210 and the second portion 220, but is not limited to this. Alternatively, the heat exchanger may be arranged in two parts. In addition, it is illustrated that the tube of the heat exchanger, through which the phase change material (refrigerant) passes, is connected through the plurality of tubes, but the arrangement position and shape of the plurality of tubes may be changed.

While the present disclosure has been particularly described with reference to exemplary embodiments, it should be understood by those of skilled in the art that various changes in form and details may be made without departing from the spirit and scope of the present disclosure.

The invention claimed is:

1. An outdoor display apparatus comprising:
   a case comprising an inlet and an outlet;
   a display module disposed inside the case and comprising a display panel on which an image seen through at least a portion of the case is displayed; and
   a heat exchanger disposed to receive heat from the display module,
   wherein the heat exchanger comprises
   a first portion located on a first flow path formed to circulate air to the display module, at least a portion of the first portion being disposed in contact with the display module;
   a second portion provided to receive heat from the first portion, and located on a second flow path on which outside air is heat-exchanged with air; and
   a phase change material provided to circulate between the first portion and the second portion, and provided to change a phase from a fluid to a gas,
   wherein the case comprises a partition wall provided to isolate the first flow path and the second flow path from each other, and
   the first portion and the second portion are disposed obliquely.

2. The outdoor display apparatus of claim 1, wherein the heat exchanger comprises
   a head portion provided to receive heat from the display module and provided to accommodate the phase change material therein;
   a tube portion connected to the head portion to circulate the phase change material; and
   a heat exchange fin portion provided to increase a heat transfer of the tube portion.

3. The outdoor display apparatus of claim 2, wherein the first portion and the second portion are provided to be connected via the tube portion so as to communicate with each other.

4. The outdoor display apparatus of claim 1, wherein the partition wall is provided to isolate at least a portion of the first portion and the second portion.

5. The outdoor display apparatus of claim 1, wherein the first portion is positioned lower than the second portion.

6. The outdoor display apparatus of claim 2, wherein the heat exchanger comprises a partition wall mounting portion formed on at least a portion of the heat exchange fin portion.

7. The outdoor display apparatus of claim 1, wherein the heat exchanger comprises any one of a plurality of cooling fins or heat sinks or heat pipes.

8. The outdoor display apparatus of claim 1, wherein the first flow path is formed in closed space and further comprises a first fan configured to circulate air.

9. The outdoor display apparatus of claim 1, wherein the second flow path further comprises a second fan provided to allow air, which is sucked through the inlet, to be heat-exchanged through the second portion and to be discharged through the outlet.

10. The outdoor display apparatus of claim 2, wherein the heat exchange fin portion comprises any one of a stack fin or a folded fin.

11. The outdoor display apparatus of claim 1, wherein the heat exchanger comprises at least one of copper, stainless steel, aluminum, and plastic.

* * * * *